United States Patent [19]
Zhou et al.

[11] Patent Number: 6,156,408
[45] Date of Patent: Dec. 5, 2000

[54] DEVICE FOR REWORKABLE DIRECT CHIP ATTACHMENT

[75] Inventors: Wen Xu Zhou, Schaumburg; Daniel Roman Gamota; Sean Xin Wu, both of Palatine; Chao-pin Yeh, Schaumburg; Karl W. Wyatt, Cary, all of Ill.; Chowdary Ramesh Koripella, Albuquerque, N. Mex.

[73] Assignee: Motorola, Inc., Schaumburg, Ill.

[21] Appl. No.: 08/920,441

[22] Filed: Aug. 29, 1997

[51] Int. Cl.⁷ .................................................... B32B 3/10
[52] U.S. Cl. ....................... 428/131; 361/768; 361/770; 361/771; 228/56.3; 228/180.22; 228/189; 228/216; 228/246; 428/901; 174/255
[58] Field of Search .................... 29/832, 840, 848, 29/858; 428/131, 901; 228/180.22, 56.3, 246, 189, 216; 361/767, 768–771, 76.8; 174/255

[56] References Cited

U.S. PATENT DOCUMENTS

| | | | |
|---|---|---|---|
| 4,701,362 | 10/1987 | Suzuki et al. | 428/131 |
| 5,024,372 | 6/1991 | Altman et al. | 228/180.22 |
| 5,039,628 | 8/1991 | Carey | 29/832 |
| 5,086,558 | 2/1992 | Grube et al. | 29/832 |
| 5,147,210 | 9/1992 | Patterson et al. | 29/832 |
| 5,242,097 | 9/1993 | Socha | 228/56.3 |
| 5,262,226 | 11/1993 | Yoshida | 428/901 |
| 5,413,964 | 5/1995 | Massingill et al. | 228/180.22 |
| 5,427,865 | 6/1995 | Mullen III, et al. | 228/56.3 |
| 5,478,778 | 12/1995 | Tanisawa | 228/180.22 |
| 5,480,835 | 1/1996 | Carney et al. | 228/180.22 |
| 5,545,465 | 8/1996 | Gaynes et al. | 228/56.3 |
| 5,553,769 | 9/1996 | Ellerson et al. | 228/180.22 |
| 5,611,140 | 3/1997 | Kulesza et al. | 29/840 |
| 5,652,055 | 7/1997 | King et al. | 428/901 |
| 5,672,260 | 9/1997 | Carey et al. | 228/180.22 |
| 5,700,715 | 12/1997 | Pasch | 228/180.22 |
| 5,718,361 | 2/1998 | Braun et al. | 228/180.22 |
| 5,720,100 | 2/1998 | Skipor et al. | 29/840 |
| 5,803,340 | 9/1998 | Yeh et al. | 228/56.3 |

Primary Examiner—Cathy F. Lam
Attorney, Agent, or Firm—Darleen J. Stockley

[57] ABSTRACT

The method (400, 500) and device (200) for reworkable direct chip attachment include a thermal-mechanical and mechanical stable solder joint for arranging connection pads on a top surface of the circuit board to facilitate connection for electronic elements, and affixing a reinforcement having apertures to accommodate solder joints to the top surface of the circuit board to facilitate solder attachment of the connection pads to the electronic elements wherein the reinforcement constrains deformation of the circuit board to provide reliable solder joints and facilitates attachment and removal of electronic elements from the circuit board.

8 Claims, 3 Drawing Sheets

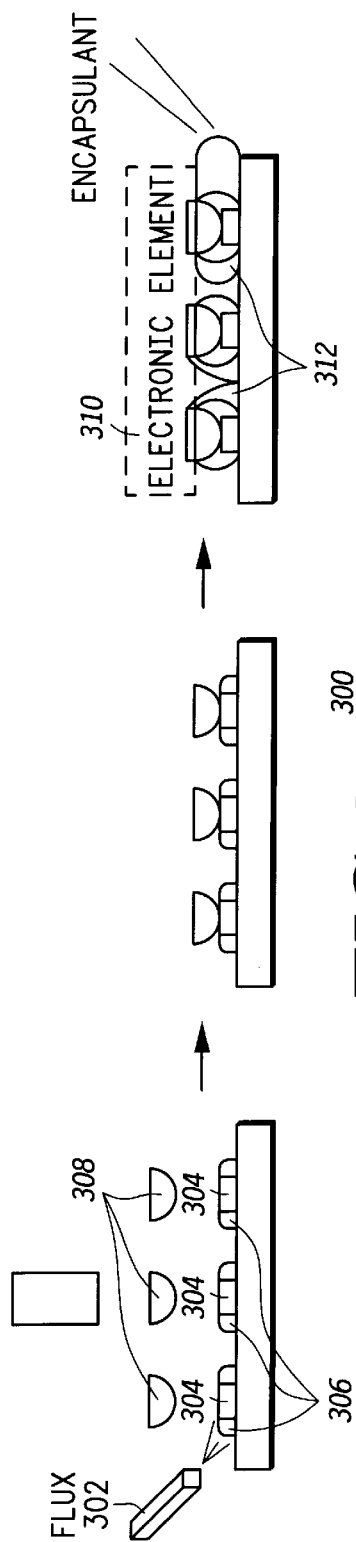
FIG.3 —PRIOR ART—
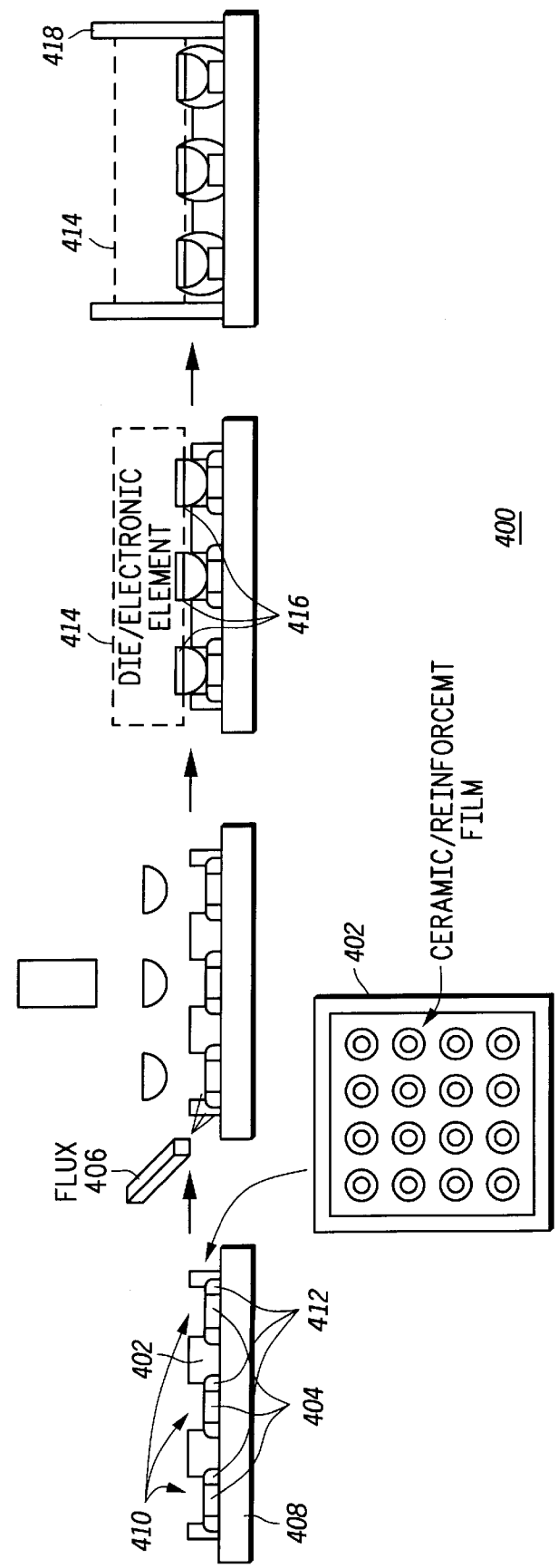
FIG.4

DEVICE FOR REWORKABLE DIRECT CHIP ATTACHMENT

FIELD OF THE INVENTION

The present invention relates to improving solder joint reliability and reworkability, and more particularly, to improving thermal-mechanical and mechanical stability of solder joints.

BACKGROUND OF THE INVENTION

Portable electrical products typically use an underencapsulant for attachment of electrical elements to circuit boards as a mechanism to enhance assembly reliability. Studies have shown that under-encapsulant can improve solder joint reliability by a factor of 5 to 10 times.

Thermoset-based encapsulants have been widely used due to their thermal polymeric crosslinking stability, lower coefficients of thermal expansion, high bonding strength, and prior-curing flow characteristics at low temperatures. However, a major liability of thermoset-based encapsulants is their poor re-workability. That is, once the under-encapsulant is cured, there is no easy way to remove it.

Alternatives such as chemical etching and mechanical detaching are not viable for DCA (Direct Chip Attachment) applications since these processes tend to damage the die and/or the substrate.

Thus, there is a need for a method and DCA assembly that provides reworkability without damaging a die or a substrate.

BRIEF DESCRIPTION OF THE DRAWINGS

FIG. 3 is a schematic representation of the process for manufacturing a DCA assembly as is known in the art.

FIG. 4 is a schematic representation of a process for manufacturing a DCA assembly in accordance with the present invention.

DETAILED DESCRIPTION OF A PREFERRED EMBODIMENT

The present invention eliminates the use of under-encapsulant in a direct chip attachment assembly to provide a reworkable assembly. In this manner, the present invention allows removal of failed electrical elements without destruction of circuit board, thus decreasing overall assembly time and cost.

Figure 1:
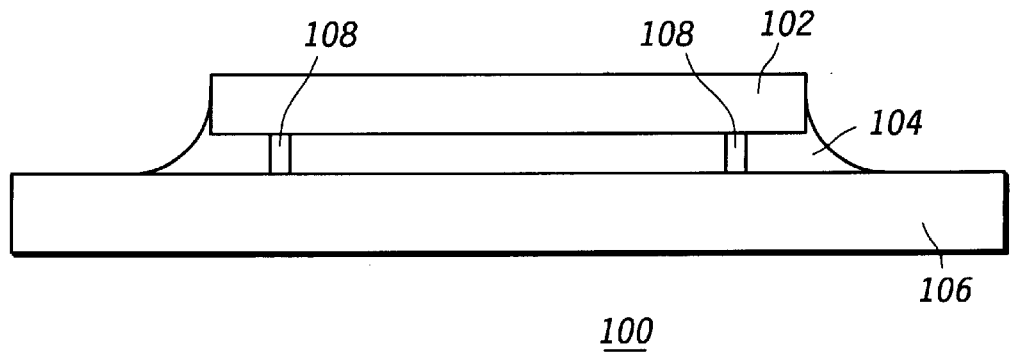
FIG. 1 is a diagrammatic representation of a DCA structure as is known in the art.

FIG. 1, numeral 100, is a diagrammatic representation of a DCA structure as is known in the art. An electronic element (102) is attached to a circuit board (106) using a solder joint (108) and an encapsulant (104) is applied to fill in the space between the electronic element (102) and the circuit board (106). This type of assembly prohibits removal of defective electronic elements, resulting in loss of an entire circuit board when the electric element is faulty.

Figure 2:
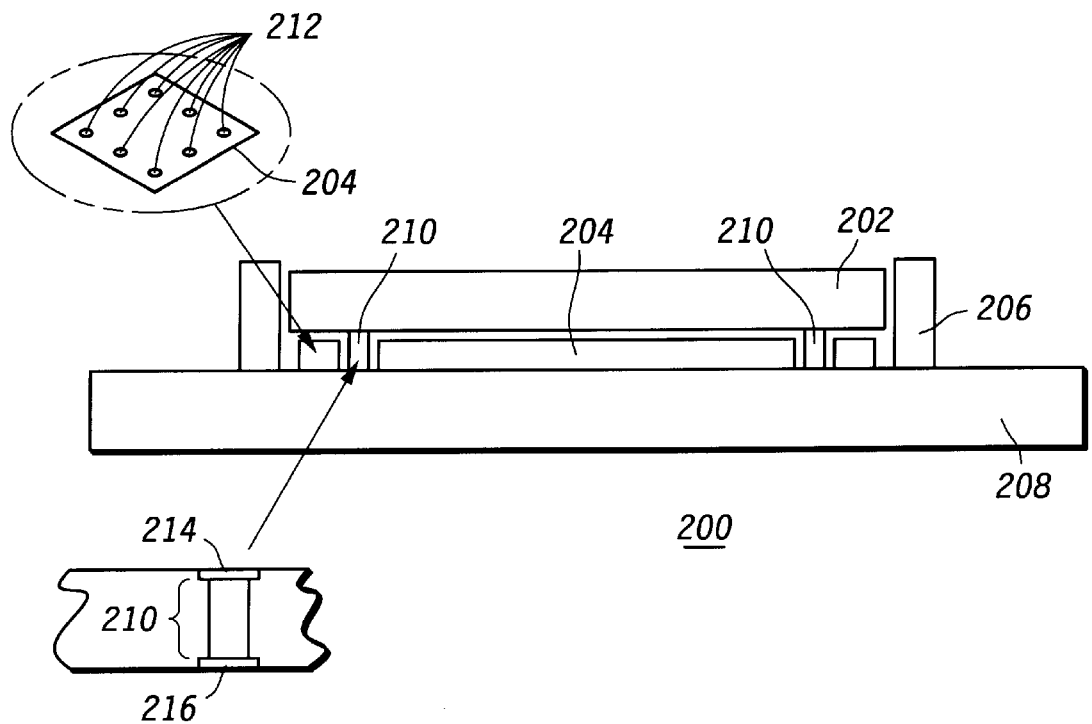
FIG. 2 is a diagrammatic representation of a DCA structure in accordance with the present invention.

FIG. 2, numeral 200, is a diagrammatic representation of a DCA structure in accordance with the present invention. The electronic device includes a reinforcement (204) to provide efficient electronic element (202, . . . ) replacement and to enhance solder joint reliability. An electronic device has a circuit board (208) with connection pads (216, . . . ) on a top surface of the circuit board (208) that are arranged to facilitate connection to connection pads (214, . . . ) for electronic elements (202, . . . ), and a reinforcement (204) having apertures (212) to accommodate solder joints (210), the reinforcement (204) being affixed on the top surface of the circuit board (208) and arranged to facilitate solder attachment of the connection pads (216, . . . ) of the circuit board (208) to the connection pads (214, . . . ) of the electronic elements (202, . . . ). The reinforcement (204) constrains deformation of the circuit board (208) to provide reliable solder joints (210) and facilitates attachment and removal of electronic elements (202, . . . ) from the circuit board (208).

The electronic device may further include a frame/collar (206) arranged around the electronic elements (202, . . . ) and affixed to the circuit board (208) for providing local reinforcement of the circuit board (208) with respect to the electronic elements (202, . . . ).

The reinforcement (204) typically consists of ceramic or another material having a coefficient of thermal expansion consistent with the coefficient of thermal expansion of the electronic element (202, . . . ) to be placed on the circuit board (208) and having a Young's modulus greater than the Young's modulus of the circuit board (208). The electronic elements (202, . . . ) generally include integrated circuits and/or active devices. An active device may be any electrical device that includes at least one integrated circuit. Prior art, "Assembly Having a Frame Embedded in a Polymeric Encapsulant and Method for Forming Same," by Andrew F. Skipor, Daniel Roman Gamota, Chao Pin Yeh, Wen Xu Zhou, and Karl W. Wyatt, U.S. patent application Ser. No. 08/581,695, filed on Dec. 29, 1995, describes related technology.

The electronic devices (202, . . . ) are typically utilized in cellular phones, pagers, personal communication devices (PCDs), camcorders and/or portable electronic units. Portable electronic units may include laptop computers, electronic games and the like.

FIG. 3, numeral 300, is a schematic representation of the process for manufacturing a DCA assembly as is known in the art. Flux (302) is applied to connection pads (304) that have been coated with solder paste (306; typically eutectic). Then solder (308) having a higher melting point than the solder paste (306) is applied to the connection pads (304) that are coated with solder paste (306), and an electronic element (310) is arranged so that its connection pads (312) are affixed to the high melting point solder (308).

FIG. 4, numeral 400, is a schematic representation of a process for manufacturing a DCA assembly in accordance with the present invention. Typically, an approximately 75 micron thick reinforcement film (402) (such as ceramic film) having a plurality of apertures (410) to accommodate a plurality of connection pads (404) is first adhered to a circuit board (408) to confine the board thermal expansion. The plurality of connection pads (404) of the circuit board (408) may be encased in eutectic solder (412), or alternatively, the encasement of the connection pads (404) in eutectic solder (412) may be eliminated due to the use of the ceramic film (402) that reduces stress on a solder joint caused by a coefficient of thermal expansion mismatch between a die or electric element and the circuit board (408). Flux (406) is dispensed to clean the connection. Solder is placed on the connection pad (where no eutectic solder is used), or alternatively, on the eutectic solder encased connection pad. For example, one implementation of the die bump may utilize the metallurgy of 97%Pb/3%Sn. The die/electric element (414) is arranged so that its connection pads (416) are aligned with the solder, and the standard reflow process, as is known in the art, is then implemented. A ceramic frame (418), for example, a square ceramic frame, may be affixed to the circuit board (108) to protect solder joints and the die from mechanical bend loading due to handling. Typically the ceramic film has a coefficient of thermal expansion (CTE) of −2 to 7 PPM/° C. and a Young's Modulus of approximately 300 GPa (GigaPascals). Since the dielectric constant is typically approximately 6, the signal coupling between the board and the die is reliable. For perimeter array applications, the size of the ceramic film is generally smaller than the distance between the two opposite inner solder joints. For area array applications, the size of the ceramic film is typically slightly smaller than the size of the die. Holes are drilled in the ceramic film in accordance with the die footprint. The terminology "die" and "electronic element" are used interchangeably herein. For example, an integrated circuit may be an electronic element.

Figure 5:
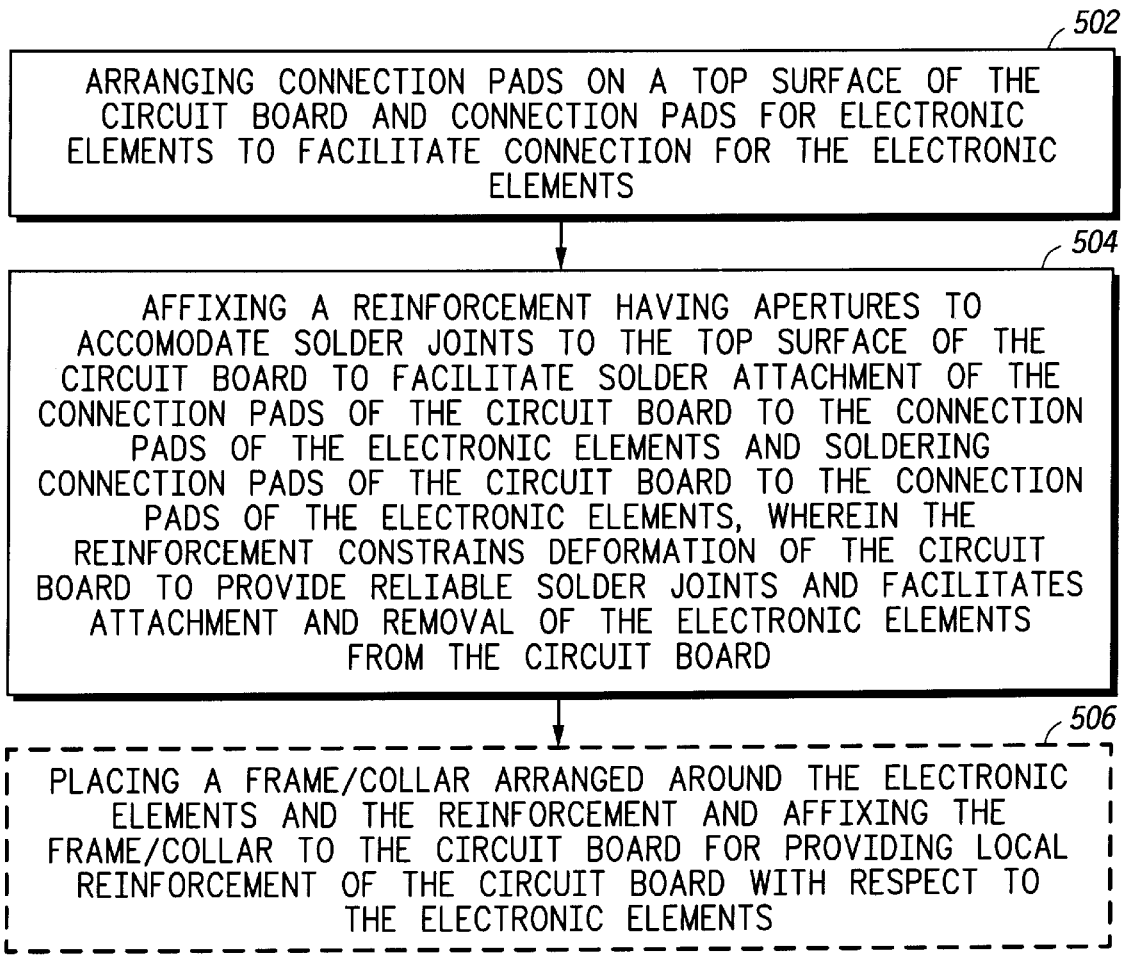
FIG. 5 is a flow chart showing one embodiment of steps in accordance with the method of the present invention.

FIG. 5, numeral 500, is a flow chart showing one embodiment of steps in accordance with the method of the present invention. The method provides a thermal-mechanical and mechanical stable solder joint and includes the steps of: A) arranging (502) connection pads on a top surface of the circuit board and connection pads for electronic elements to facilitate connection for the electronic elements, and B) affixing (504) a reinforcement having apertures to accommodate solder joints to the top surface of the circuit board to facilitate solder attachment of the connection pads of the circuit board to the connection pads of the electronic elements and soldering connection pads of the circuit board to the connection pads of the electronic elements, wherein the reinforcement constrains deformation of the circuit board to provide reliable solder joints and facilitates attachment and removal of the electronic elements from the circuit board.

Where selected, the method may further include placing (506) a frame/collar arranged around the electronic elements and the reinforcement and affixing the frame/collar to the circuit board for providing local reinforcement of the circuit board with respect to the electronic elements. The reinforcement is typically ceramic or another material having a coefficient of thermal expansion consistent with the coefficient of thermal expansion of the electronic element to be placed on the circuit board and having a Young's modulus greater than the Young's modulus of the circuit board. The electronic elements generally include integrated circuits and/or active devices.

We claim:

1. An electronic device having a reinforcement to provide efficient electronic element replacement and to enhance solder joint reliability, the electronic device being situated on a circuit board comprising:
    A) connection pads on a top surface of the circuit board, arranged to facilitate connection to connection pads for electronic elements, and
    B) a reinforcement having apertures to accommodate solder joints, the reinforcement being affixed on the top surface of the circuit board and arranged to facilitate solder attachment of the connection pads of the circuit board to the connection pads of the electronic elements;
    C) a frame/collar arranged around the electronic elements and affixed to the circuit board for providing local reinforcement of the circuit board with respect to the electronic elements;
    wherein the reinforcement constrains deformation of the circuit board to provide reliable solder joints and facilitates attachment and removal of electronic elements from the circuit board.

2. The electronic device of claim 1 wherein the reinforcement consists of one of:
    A) ceramic;
    B) a material having a coefficient of thermal expansion consistent with the coefficient of thermal expansion of the electronic element to be placed on the circuit board and having a Young's modulus greater than the Young's modulus of the circuit board.

3. The electronic device of claim 1 wherein the electronic elements are at least one of:
    A) integrated circuits ;
    B) active devices.

4. A cellular phone having an electronic device with a reinforcement to provide efficient electronic element replacement and to enhance solder joint reliability, the electronic device having a circuit board comprising:
    A) connection pads on a top surface of the circuit board, arranged to facilitate connection to connection pads for electronic elements, and
    B) a reinforcement having apertures to accommodate solder joints, the reinforcement being affixed on the top surface of the circuit board and arranged to facilitate solder attachment of the connection pads of the circuit board to the connection pads of the electronic elements;
    C) a frame/collar arranged around the electronic elements and affixed to the circuit board for providing local reinforcement of the circuit board with respect to the electronic elements;
    wherein the reinforcement constrains deformation of the circuit board to provide reliable solder joints and facilitates attachment and removal of electronic elements from the circuit board.

5. A pager having an electronic device with a reinforcement to provide efficient electronic element replacement and to enhance solder joint reliability, the electronic device having a circuit board comprising:
    A) connection pads on a top surface of the circuit board, arranged to facilitate connection to connection pads for electronic elements, and
    B) a reinforcement having apertures to accommodate solder joints, the reinforcement being affixed on the top surface of the circuit board and arranged to facilitate solder attachment of the connection pads of the circuit board to the connection pads of the electronic elements;
    C) a frame/collar arranged around the electronic elements and affixed to the circuit board for providing local reinforcement of the circuit board with respect to the electronic elements;
    wherein the reinforcement constrains deformation of the circuit board to provide reliable solder joints and facilitates attachment and removal of electronic elements from the circuit board.

6. A personal communication device having an electronic device with a reinforcement to provide efficient electronic element replacement and to enhance solder joint reliability, the electronic device having a circuit board comprising:
    A) connection pads on a top surface of the circuit board, arranged to facilitate connection to connection pads for electronic elements, and
    B) a reinforcement having apertures to accommodate solder joints, the reinforcement being affixed on the top surface of the circuit board and arranged to facilitate solder attachment of the connection pads of the circuit board to the connection pads of the electronic elements;

C) a frame/collar arranged around the electronic elements and affixed to the circuit board for providing local reinforcement of the circuit board with respect to the electronic elements;

wherein the reinforcement constrains deformation of the circuit board to provide reliable solder joints and facilitates attachment and removal of electronic elements from the circuit board.

7. A camcorder having an electronic device with a reinforcement to provide efficient electronic element replacement and to enhance solder joint reliability, the electronic device having a circuit board comprising:

A) connection pads on a top surface of the circuit board, arranged to facilitate connection to connection pads for electronic elements, and B) a reinforcement having apertures to accommodate solder joints, the reinforcement being affixed on the top surface of the circuit board and arranged to facilitate solder attachment of the connection pads of the circuit board to the connection pads of the electronic elements;

C) a frame/collar arranged around the electronic elements and affixed to the circuit board for providing local reinforcement of the circuit board with respect to the electronic elements;

wherein the reinforcement constrains deformation of the circuit board to provide reliable solder joints and facilitates attachment and removal of electronic elements from the circuit board.

8. A portable electronic unit having an electronic device with a reinforcement to provide efficient electronic element replacement and to enhance solder joint reliability, the electronic device having a circuit board comprising:

A) connection pads on a top surface of the circuit board, arranged to facilitate connection to connection pads for electronic elements, and B) a reinforcement having apertures to accommodate solder joints, the reinforcement being affixed on the top surface of the circuit board and arranged to facilitate solder attachment of the connection pads of the circuit board to the connection pads of the electronic elements;

C) a frame/collar arranged around the electronic elements and affixed to the circuit board for providing local reinforcement of the circuit board with respect to the electronic elements;

wherein the reinforcement constrains deformation of the circuit board to provide reliable solder joints and facilitates attachment and removal of electronic elements from the circuit board.

* * * * *